(12) United States Patent
Bouche et al.

(10) Patent No.: US 7,897,436 B2
(45) Date of Patent: Mar. 1, 2011

(54) PROCESS FOR PACKAGING MICRO-COMPONENTS USING A MATRIX

(75) Inventors: Guillaume Bouche, Grenoble (FR); Bernard Andre, Grenoble (FR); Nicolas Sillon, Fontaine (FR)

(73) Assignees: STMicroelectronics, S.A., Montrouge (FR); Commissariat A l'Energie Atomique, Paris (FR)

( * ) Notice: Subject to any disclaimer, the term of this patent is extended or adjusted under 35 U.S.C. 154(b) by 608 days.

(21) Appl. No.: 11/289,776

(22) Filed: Nov. 28, 2005

(65) Prior Publication Data
US 2006/0192260 A1    Aug. 31, 2006

(30) Foreign Application Priority Data

Nov. 26, 2004 (FR) .................................. 04 12570
Nov. 26, 2004 (FR) .................................. 04 12572

(51) Int. Cl.
*H01L 21/00* (2006.01)

(52) U.S. Cl. .................. 438/118; 438/125; 438/126; 438/127; 257/684; 257/687; 257/704; 257/E33.056; 257/E33.059; 257/E23.127; 257/E21.504

(58) Field of Classification Search ................ 257/415, 257/678, 684, 687, 701, 704, E33.056, E33.057, 257/E33.058, E33.059, E23.116, E23.123, 257/E23.124, E23.125, E23.127, E23.128, 257/E21.504; 438/51, 110, 112, 118, 125, 438/126, 127
See application file for complete search history.

(56) References Cited

U.S. PATENT DOCUMENTS

| 5,577,656 A | 11/1996 | Temple et al. |
| 5,668,033 A | 9/1997 | Ohara et al. |
| 5,915,168 A | 6/1999 | Salatino et al. |
| 6,429,506 B1 | 8/2002 | Fujii et al. |
| 6,722,030 B1 | 4/2004 | Stelzl et al. |
| 6,809,412 B1 * | 10/2004 | Tourino et al. ............... 257/678 |

(Continued)

FOREIGN PATENT DOCUMENTS

EP    1 346 949 A    9/2003

(Continued)

OTHER PUBLICATIONS

Mescheder U M et al.; "Local Laser Bonding for Low Temperature Budget", Sensors and Actuators A, Elsevier Sequoia S.A., Lausanne, CH, vol. 97-98, Apr. 1, 2002, pp. 422-427, XP004361631.

(Continued)

*Primary Examiner*—Matthew C Landau
*Assistant Examiner*—Colleen E Snow
(74) *Attorney, Agent, or Firm*—Lisa K. Jorgenson; Kevin D. Jablonski; Graybeal Jackson LLP

(57) ABSTRACT

A process for packaging a number of micro-components on the same substrate wafer, in which each micro-component is enclosed in a cavity. This process includes making a covering plate comprising a re-useable matrix, a polymer layer, and a metal layer; covering the wafer with the covering plate; applying a contact pressure equal to at least one bar on the covering plate and on the wafer; heating the metal layer during pressing until sealing is obtained, each cavity thus being provided with a sealing area and closed by metal layer; and dissolving the polymer to recover and recycle the matrix.

30 Claims, 1 Drawing Sheet

U.S. PATENT DOCUMENTS

| | | | |
|---|---|---|---|
| 6,894,358 B2 | 5/2005 | Leib et al. | |
| 6,905,945 B1 | 6/2005 | Barmatz et al. | |
| 7,005,732 B2 | 2/2006 | Horning et al. | |
| 7,015,060 B1 | 3/2006 | Kubena et al. | |
| 7,151,426 B2 | 12/2006 | Stafford et al. | |
| 7,221,033 B2 | 5/2007 | Lutz et al. | |
| 2002/0046877 A1* | 4/2002 | Hirai et al. | 174/250 |
| 2002/0168797 A1* | 11/2002 | DiStefano et al. | 438/106 |
| 2004/0028849 A1 | 2/2004 | Stark et al. | |
| 2004/0067604 A1 | 4/2004 | Ouellet et al. | |
| 2004/0087043 A1 | 5/2004 | Lee et al. | |
| 2004/0188821 A1 | 9/2004 | Chen et al. | |
| 2004/0207059 A1 | 10/2004 | Hong | |
| 2005/0141240 A1* | 6/2005 | Hata et al. | 362/600 |
| 2008/0252988 A1* | 10/2008 | Tormen et al. | 359/652 |

FOREIGN PATENT DOCUMENTS

| | | |
|---|---|---|
| WO | WO 03/084861 A | 10/2003 |

OTHER PUBLICATIONS

French Search Report for FR 0412572 dated Jul. 12, 2005.
French Search Report for FR 0412570 dated Jul. 11, 2005.

* cited by examiner

PROCESS FOR PACKAGING MICRO-COMPONENTS USING A MATRIX

PRIORITY CLAIM

This application claims priority from French patent application Nos. 04 12572, filed Nov. 26, 2004, and 04 12570, filed Nov. 26, 2004, which are incorporated herein by reference.

CROSS REFERENCE TO RELATED APPLICATION

This application is related to U.S. patent application Ser. No. 11/288942 entitled MICRO-COMPONENT PACKAGING PROCESS AND SET OF MICRO-COMPONENTS RESULTING FROM THIS PROCESS, which has a common filing date and owner and which is incorporated by reference.

TECHNICAL FIELD

An embodiment of the invention relates to techniques for packaging electronic micro-components in general.

More precisely, an embodiment of the invention relates to a process for packaging micro-components such as electro-mechanical micro-systems, made in large numbers on the same substratewafer, this process including enclosing each micro-component in a cavity surrounded by at least two walls, one of which is formed by the substrate.

BACKGROUND

Despite many manufacturing techniques developed in micro-electronics, packaging of micro-components and electromechanical micro-systems in particular, remains a relatively long, complex and expensive operation.

SUMMARY

An embodiment of the invention is a packaging process without some of the defects present in the prior-art processes.

Consequently, a process according to an embodiment of the invention comprises a preparatory operation that includes making a covering plate sized to simultaneously cover several micro-components or all micro-components in the wafer and formed from a stack comprising at least one matrix made of a mechanically and chemically stable material in a lower face in which depressions are formed, a layer of polymer material deposited on the lower face of the matrix and in which a lower face remote from the matrix is provided with depressions approximately reproducing the shape of the depressions in the matrix, and a metal layer deposited on the lower face of the layer of polymer material and the lower face of which is provided with depressions approximately reproducing the depressions on the lower face of the layer of polymer material, this process also comprising a sealing step including a covering operation followed by concomitant pressing and heating operations, leading to the metal layer being sealed onto the upper face of the wafer, the metal layer thus forming a second wall for each cavity, and a release operation subsequent to the sealing step, including releasing the matrix from the layer of polymer material, by at least partially dissolving this layer in a solvent, the matrix thus being re-useable.

The location adjectives such as "lower" and "upper" should be interpreted in a relative manner in a three-dimensional coordinate system chosen without reference to the earth's coordinate system.

It may be advantageous if the covering operation includes covering the wafer by the covering plate, the metal layer thus at least locally forming an intermediate layer in contact with the layer of polymer material and also with the upper face of the wafer, and the pressing operation including applying contact pressure on the wafer and on the matrix equal to at least one bar, in that the sealing operation includes heating the metal layer in the intermediate layer at least a plurality of areas forming sealing areas until sealing is achieved, each cavity having at least one sealing area, and the sealing operation is used by irradiating the metal layer through the matrix and the layer of polymer material, by electromagnetic radiation absorbed by this metal layer, both the matrix and the layer of polymer material being made from materials that are transparent to this electromagnetic radiation.

Electromagnetic radiation may be composed of a light beam in the infrared range, for example produced by an Nd YAG laser.

Furthermore, electromagnetic radiation may be applied sequentially or in parallel over the entire covering plate.

In particular it is possible (although optional) for the metal to be composed of gold or to contain gold and for the substrate and/or matrix to be composed of silicon or to contain silicon.

Each cavity may be integrally surrounded by its sealing area.

The packaging process as defined above may be completed by a cutting operation after the release operation, including separating the micro-components on a particular wafer from each other, each micro-component remaining encapsulated in its cavity.

The polymer material may be chosen to degrade during heating of the metal layer, this heating thus causing separation of the lower face of the polymer material layer from the metal layer.

BRIEF DESCRIPTION OF THE DRAWINGS

Other characteristics and advantages of embodiments of the invention will become clear after reading the following description given for guidance and that is in no way limitative, with reference to the attached drawings in which.

DETAILED DESCRIPTION

Figure 1:
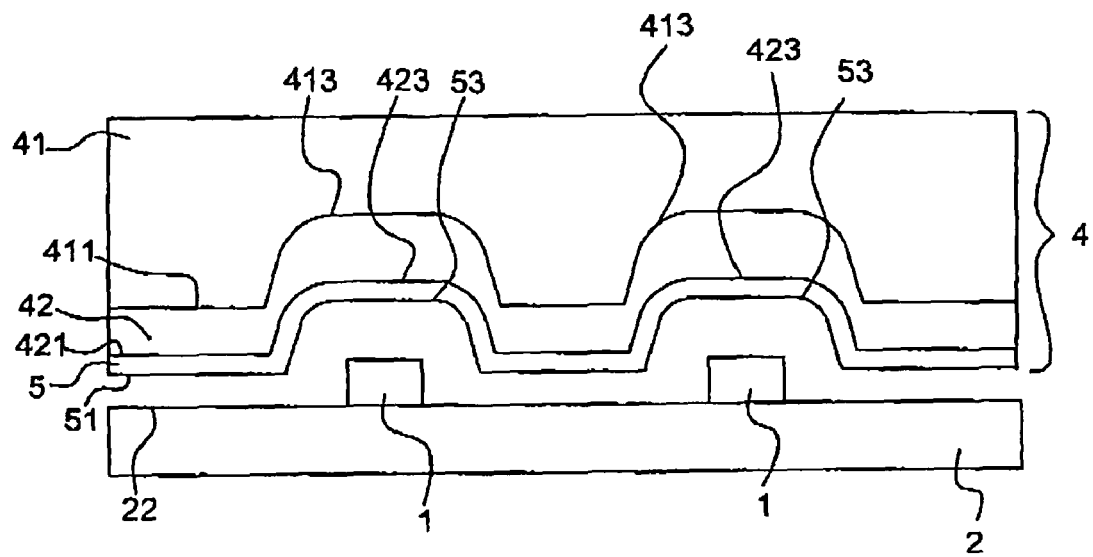
FIG. 1 shows an enlarged and diagrammatic partial sectional view of a substrate wafer and a covering plate, prepared so as to seal them in accordance with a process according to an embodiment of the invention.
Figure 2:
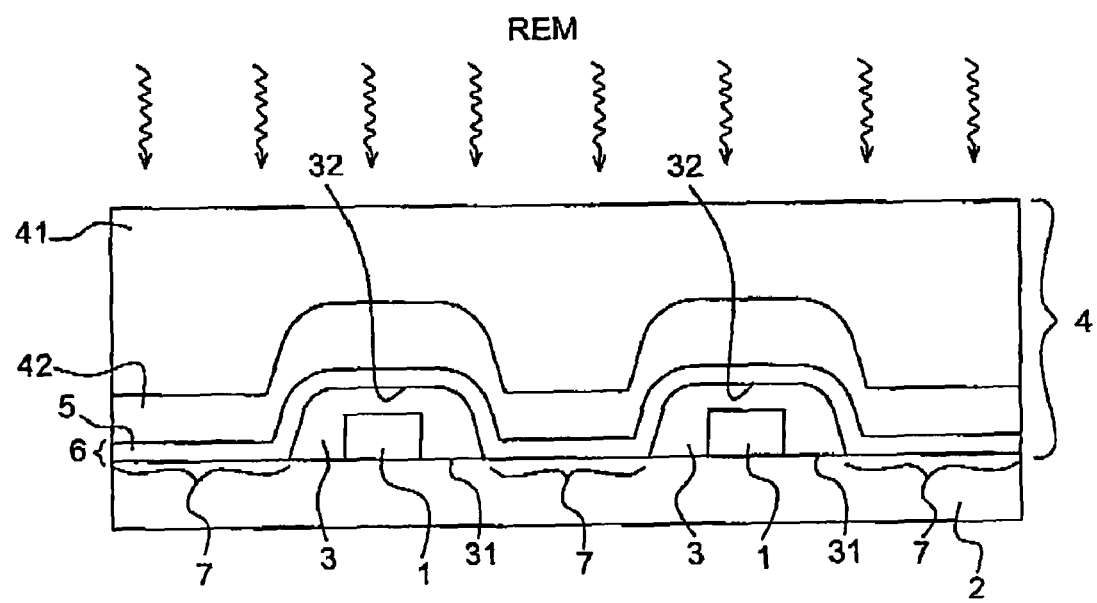
FIG. 2 shows an enlarged and diagrammatic partial sectional view of a substrate wafer and a covering plate during sealing using a process according to an embodiment of the invention.

As already mentioned, an embodiment of the invention relates particularly to a process for packaging micro-components 1, and particularly electromechanical micro-systems, previously made with a plurality of micro-systems on the same wafer or substrate disk 2, for example made of a semiconducting material such as silicon or a composite material such as glass covered with a polysilicon layer.

An end purpose of this process is to enclose each micro-component 1 in a cavity 3 surrounded by several walls such as 31 and 32, the first wall 31 of which is formed by the substrate 2.

To achieve this, a process according to an embodiment of the invention firstly includes a preparatory operation that includes making a covering plate 4 sized to simultaneously cover several micro-components 1 of the wafer 2, and preferably all micro-components 1 of this wafer.

This covering plate 4 is formed from a stack comprising a matrix 41, a layer 42 made of a polymer material, and a layer of metal 5, for example gold.

The matrix 41 is made from a mechanically and chemically stable material, for example silicon, and is provided with depressions 413 on its lower face 411 arranged in the same way as the micro-components 1 on the wafer 2.

In this case, the terms "lower" and "upper" refer to a certain arbitrary orientation in space, corresponding to the drawings.

Furthermore, according to an embodiment of the invention, the mechanical and chemical stability characteristics of the matrix 41 are understood as being limited to usage conditions of this matrix as specified below, in particular that this matrix 41 is not soluble in a solvent used to dissolve the layer 42 of polymer material.

This layer 42 of polymer material is deposited on the lower face 411 of the matrix 41, and is provided with depressions 423 on its own lower face 421 remote from the matrix 41, approximately reproducing the shape of the depressions 413 of the matrix 41.

The layer of metal 5 is deposited on the lower face 421 of the layer 42 of polymer material and itself has depressions 53 on its lower face 51 approximately reproducing the shape of the depressions 423 on the lower face 421 of the layer 42 of polymer material.

A process according to an embodiment of the invention also comprises a sealing step including a covering operation followed by concomitant pressing and heating operations, leading to sealing of the metal layer 5 on the upper face 22 of the wafer 2.

The covering operation includes covering the wafer 2 with the covering plate 4, the metal layer 5 thus at least locally forming an intermediate layer 6 in contact with both the layer 42 of polymer material and with the upper face 22 of the wafer 2, and this metal layer 5 also forming a second wall 32 for each cavity 3.

The pressing operation includes applying a contact pressure on the wafer 2 and on the matrix 41 equal to at least one bar, and typically between 1 and 5 bars.

The sealing operation includes heating the metal layer 5 in the intermediate layer 6 in several areas that will form sealing areas 7 and distributed such that each cavity 3 is adjacent to at least one such sealing area 7, until the sealing operation is complete.

The heating temperature typically reaches 400° C. locally, in other words a temperature greater than the temperature of the gold-silicon eutectic if the metal layer 5 is composed of gold or the substrate 2 is composed of silicon.

However, different and significantly higher temperatures may occur if; other metals or alloys are used, or if other materials are used for the substrate.

This sealing operation may be applied by irradiating the metal layer 5, through the matrix 41 and the layer 42 of the polymer material, by electromagnetic radiation EMR absorbed by this metal layer.

In this case, the matrix 41 of the layer 42 of the polymer material may be made from materials that are transparent to this electromagnetic radiation EMR.

The electromagnetic radiation EMR may be composed of a light beam: in the infrared range, for example a beam with a wavelength of 1064 nm produced by a pulsed or continuous Nd YAG laser.

The electromagnetic radiation EMR may be applied in the form of a selectively directed beam, by relative movement of this beam and the wafer 2, onto areas to be heated that will become sealing areas 7.

However, it can also be applied sequentially or in parallel over the entire surface of the covering plate 4, the micro-components 1 being protected from direct irradiation by the metal layer 5 over them.

The polymer material of the layer 42 may be chosen from among polymers known to degrade when their temperature increases.

Thus, degradation of this layer 42 resulting from heating of the metal layer 5 causes spontaneous separation of the lower face 421 of this layer 42 of polymer material from the metal layer 5.

After the sealing step, a process according to an embodiment of the invention includes a release operation that includes releasing the matrix 41 from the layer 42 of polymer material by at least partially dissolving the layer 42 in a solvent.

Due to its mechanical; and chemical stability, the matrix 41 resists this treatment without damage and therefore can be reused.

To achieve relatively good protection of each micro-component 1, it may be useful if the sealing area 7 associated with each cavity 3 fully surrounds this cavity and thus seals it.

Subsequent to the release operation, a process according to an embodiment of the invention, includes a cutting operation that includes separating the micro-components 1 on the same wafer 2 from each other by cutting the wafer 2 and the metallic layer 5 around each cavity 3, each micro-component 1 thus remaining encapsulated in its cavity 3.

The described embodiments of the invention also relate to any set of micro-components such as electromechanical micro-systems 1 made by using a process like that described above. Such a set of micro-components may be part of an integrated circuit or a system.

From the foregoing it will be appreciated that, although specific embodiments of the invention have been described herein for purposes of illustration, various modifications may be made without deviating from the spirit and scope of the invention.

What is claimed is:

1. Process for packaging a number of micro-components such as electromechanical micro-systems on the same substrate wafer, this process including an operation including enclosing each micro-component in a cavity surrounded by at least two walls, one of which is formed by the substrate, wherein it comprises a preparatory operation consisting of making a covering plate sized to simultaneously cover several micro-components or all micro-components in the wafer and formed from a stack comprising at least one matrix made of a mechanically and chemically stable material in a lower face in which depressions are formed, a layer of polymer material deposited on the lower face of the matrix and in which a lower face remote from the matrix is provided with depressions approximately reproducing the shape of the depressions in the matrix, and a metal layer deposited on the lower face of the layer of polymer material and the lower face of which is provided with depressions approximately reproducing the depressions on the lower face of the layer of polymer material, this process also comprising a sealing step including a covering operation followed by concomitant pressing and heating operations, leading to the metal layer being sealed onto the upper face of the wafer and leading to the metal layer being separated from the layer of polymer material, the metal layer thus forming a second wall for each cavity, and a release operation subsequent to the sealing step, comprising releasing the matrix from the layer of polymer material, by at least partially dissolving this layer in a solvent, the matrix thus being re-useable.

2. Packaging process according to claim 1, wherein the metal is composed of gold or contains gold.

3. Packaging process according to claim 1, wherein the substrate is composed of silicon or contains silicon.

4. Packaging process according to claim 1, wherein the matrix is composed of silicon or contains silicon.

5. Packaging process according to claim 1, wherein the process comprises a cutting operation after the release operation, comprising separating the micro-components on the same wafer from each other, each micro-component remaining encapsulated in its cavity.

6. Process for packaging a number of micro-components such as electromechanical micro-systems on the same substrate wafer, this process including an operation including enclosing each micro-component in a cavity surrounded by at least two walls, one of which is formed by the substrate, wherein it comprises a preparatory operation consisting of making a covering plate sized to simultaneously cover several micro-components or all micro-components in the wafer and formed from a stack comprising at least one matrix made of a mechanically and chemically stable material in a lower face in which depressions are formed, a layer of polymer material deposited on the lower face of the matrix and in which a lower face remote from the matrix is provided with depressions approximately reproducing the shape of the depressions in the matrix, and a metal layer deposited on the lower face of the layer of polymer material and the lower face of which is provided with depressions approximately reproducing the depressions on the lower face of the layer of polymer material, this process also comprising a sealing step including a covering operation followed by concomitant pressing and heating operations, leading to the metal layer being sealed onto the upper face of the wafer, the metal layer thus forming a second wall for each cavity, and a release operation subsequent to the sealing step, comprising releasing the matrix from the layer of polymer material, by at least partially dissolving this layer in a solvent, the matrix thus being re-useable; the covering operation comprises covering the wafer by the covering plate, the metal layer thus at least locally forming an intermediate layer in contact with the layer of polymer material and also with the upper face of the wafer, and in that the pressing operation comprises applying contact pressure on the wafer and on the matrix equal to at least one bar, in that the sealing operation comprises heating the metal layer in the intermediate layer at least a plurality of areas forming sealing areas until sealing is achieved, each cavity having at least one sealing area, and in that the sealing operation is used by irradiating the metal layer through the matrix and the layer of polymer material, by electromagnetic radiation (REM) absorbed by this metal layer, both the matrix and the layer of polymer material being made from materials that are transparent to this electromagnetic radiation.

7. Packaging process according to claim 6, wherein the electromagnetic radiation is composed of a light beam in the infrared range, for example produced by an Nd YAG laser.

8. Packaging process according to claim 7, wherein each cavity is integrally surrounded by its sealing area.

9. Packaging process according to claim 6, wherein the electromagnetic radiation is applied sequentially or in parallel over the entire covering plate.

10. Process for packaging a number of micro-components such as electromechanical micro-systems on the same substrate wafer, this process including an operation including enclosing each micro-component in a cavity surrounded by at least two walls, one of which is formed by the substrate, wherein it comprises a preparatory operation consisting of making a covering plate sized to simultaneously cover several micro-components or all micro-components in the wafer and formed from a stack comprising at least one matrix made of a mechanically and chemically stable material in a lower face in which depressions are formed, a layer of polymer material deposited on the lower face of the matrix and in which a lower face remote from the matrix is provided with depressions approximately reproducing the shape of the depressions in the matrix, and a metal layer deposited on the lower face of the layer of polymer material and the lower face of which is provided with depressions approximately reproducing the depressions on the lower face of the layer of polymer material, this process also comprising a sealing step including a covering operation followed by concomitant pressing and heating operations, leading to the metal layer being sealed onto the upper face of the wafer, the metal layer thus forming a second wall for each cavity, and a release operation subsequent to the sealing step, comprising releasing the matrix from the layer of polymer material, by at least partially dissolving this layer in a solvent, the matrix thus being re-useable;

wherein the polymer material is chosen to degrade during heating of the metal layer, this heating thus causing separation of the lower face of the polymer material layer from the metal layer.

11. A method, comprising:
forming a cover plate that absorbs electromagnetic radiation in a mold that is transparent to electromagnetic radiation;
placing the cover plate on a substrate that includes microelectromechanical components such that each component is disposed in a respective cavity having a first wall formed by the cover plate and having a second wall formed by the substrate and such that a plate surface of the cover plate faces a substrate surface of the substrate; and
attaching the cover plate to the substrate.

12. The method of claim 11 wherein forming the cover plate comprises forming a layer of metal on a surface of the mold.

13. The method of claim 11 wherein forming the cover plate comprises forming a layer of metal on a surface of the mold, the surface having depressions that each include the first wall of a respective cavity.

14. The method of claim 11, further comprising:
forming a layer of polymer on a surface of the mold; and
wherein forming the cover plate comprises forming a layer of metal on the polymer layer.

15. The method of claim 11 wherein placing the cover plate comprises placing the cover plate on the substrate such that each respective cavity has third and fourth walls formed by the cover plate.

16. The method of claim 11 wherein placing the cover plate comprises placing the cover plate on the substrate such that each respective cavity has third, fourth, fifth, and sixth walls formed by the cover plate.

17. The method of claim 11 wherein placing the cover plate comprises placing the cover plate on the wafer such that each respective cavity has third and fourth walls formed by the substrate.

18. The method of claim 11 wherein placing the cover plate comprises placing the cover plate on the substrate such that each respective cavity has third, fourth, fifth, and sixth walls formed by the substrate.

19. The method of claim 11 wherein attaching the cover plate to the substrate comprises attaching a portion of the plate surface to a portion of the substrate surface.

20. The method of claim 11 wherein attaching the cover plate to the substrate comprises forming a seal between a portion of the plate surface and a portion of the substrate surface around each respective cavity.

21. The method of claim 11 wherein attaching the cover plate to the substrate comprises:
pressing a portion of the plate surface against a portion of the substrate surface; and
heating the pressed-together portions of the plate and substrate surfaces.

22. The method of claim 11, further comprising separating the cover plate from the mold after attaching the cover plate to the substrate.

23. The method of claim 11, further comprising:
forming a layer of polymer on a surface of the mold;
wherein forming the cover plate comprises forming a layer of metal on the polymer layer; and
separating the cover plate from the mold by dissolving the polymer layer.

24. The method of claim 11 further comprising forming a cover plate in a mold that is transparent to electromagnetic radiation from an infrared light beam.

25. A method, comprising:
forming a cover plate in a mold;
placing the cover plate on a substrate that includes micro-electromechanical components such that each component is disposed in a respective cavity having a first wall formed by the cover plate and having a second wall formed by the substrate and such that a plate surface of the cover plate faces a substrate surface of the substrate; and
attaching the cover plate to the substrate;
wherein attaching the cover plate to the substrate comprises irradiating an interface between a portion of the plate surface and a portion of the substrate surface with electromagnetic energy.

26. A method, comprising:
forming a cover plate in a mold, the cover plate having a first layer and a second layer and the mold having a first layer and a second layer;
attaching the cover plate to a substrate having a plurality of micro-components; and
removing the mold from the cover plate.

27. The method of claim 26, further comprising:
forming the first layer from a metal; and
forming the second layer from a polymer.

28. The method of claim 26, further comprising forming cavities in the cover plate with the mold, the cavities suitable for enclosing the micro-components between the substrate and the cover plate.

29. The method of claim 26 wherein the attaching the cover plate to the substrate further comprises forming a seal between a portion of a cover plate surface and a portion of a substrate surface around each respective cavity.

30. A method, comprising:
forming a cover plate in a mold, the cover plate having a first layer and a second layer;
attaching the cover plate to a substrate having a plurality of micro-components; and
removing the mold from the cover plate;
wherein attaching the cover plate to the substrate further comprises irradiating an interface between a portion of a cover plate surface and a portion of a substrate surface with electromagnetic energy.

* * * * *